(12) United States Patent  
Blankenship et al.

(10) Patent No.: US 9,043,667 B2
(45) Date of Patent: May 26, 2015

(54) METHOD AND SYSTEM FOR UP-LINK HARQ-ACK AND CSI TRANSMISSION

(71) Applicant: BlackBerry Limited, Waterloo (CA)

(72) Inventors: Yufei Wu Blankenship, Kildeer, IL (US); Michael Eoin Buckley, Grayslake, IL (US); Andrew Mark Earnshaw, Kanata (CA); Masoud Ebrahimi Tazeh Mahalleh, Ottawa (CA); Youn Hyoung Heo, Gyunggi-do (KR); Hua Xu, Ottawa (CA); Jun Li, Richardson, TX (US)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

(21) Appl. No.: 13/649,911

(22) Filed: Oct. 11, 2012

(65) Prior Publication Data

US 2013/0117622 A1 May 9, 2013

Related U.S. Application Data

(60) Provisional application No. 61/556,102, filed on Nov. 4, 2011.

(51) Int. Cl.
*H04L 1/18* (2006.01)
*H04L 1/00* (2006.01)
(Continued)

(52) U.S. Cl.
CPC ........... *H04L 1/0041* (2013.01); *H03M 13/136* (2013.01); *H03M 13/356* (2013.01); *H03M 13/635* (2013.01); *H03M 13/6525* (2013.01); *H04L 1/0057* (2013.01);
(Continued)

(58) Field of Classification Search
CPC .......... H03M 13/136; H03M 13/1356; H03M 13/6525; H03M 13/635; H04L 1/0057; H04L 1/0067; H04L 1/007; H04L 1/0073; H04L 1/0041; H04L 1/1671
See application file for complete search history.

(56) References Cited

U.S. PATENT DOCUMENTS 5,127,013 A * 6/1992 Yoshida ........................ 714/748
6,445,476 B1 * 9/2002 Kahn et al. .................... 398/189
(Continued)

FOREIGN PATENT DOCUMENTS

EP 1098445 A1 9/2001
EP 1811711 A1 7/2007
(Continued)

OTHER PUBLICATIONS

EP Patent Application No. 11184419.7, Extended European Search Report, Nov. 30, 2011, 5 pages.
(Continued)

*Primary Examiner* — Mujtaba K Chaudry
*Assistant Examiner* — Osman Alshack
(74) *Attorney, Agent, or Firm* — Conley Rose, P.C.; J. Robert Brown, Jr.

(57) ABSTRACT

A method and user equipment for simultaneous transmission of a first set of information bits and a second set of information bits by a user equipment, either separately encoded utilizing transmit power or rate matching to increase successful decoding of a set of information bits, or jointly encoding using a priori knowledge or bit positioning to increase successful decoding. Also, the use of joint coding where a first set of information bits is encoded first and then encoded with a second set of information bits, and modulation symbol mapping are provided.

15 Claims, 11 Drawing Sheets

(51) Int. Cl.
*H03M 13/13* (2006.01)
*H03M 13/35* (2006.01)
*H03M 13/00* (2006.01)
*H04L 1/16* (2006.01)

(52) U.S. Cl.
CPC ............ *H04L 1/0067* (2013.01); *H04L 1/007* (2013.01); *H04L 1/0073* (2013.01); *H04L 1/1671* (2013.01)

(56) References Cited

U.S. PATENT DOCUMENTS

| | | | |
|---|---|---|---|
| 7,254,769 B2 | 8/2007 | Kim et al. | |
| 8,345,794 B2 | 1/2013 | Xu et al. | |
| 2002/0141433 A1 | 10/2002 | Kwon et al. | |
| 2003/0039217 A1* | 2/2003 | Seo et al. | 370/318 |
| 2003/0108013 A1* | 6/2003 | Hwang et al. | 370/335 |
| 2003/0133497 A1* | 7/2003 | Kinjo et al. | 375/152 |
| 2003/0236071 A1 | 12/2003 | Ito | |
| 2004/0010743 A1* | 1/2004 | Lee et al. | 714/748 |
| 2004/0268206 A1* | 12/2004 | Kim et al. | 714/758 |
| 2005/0147159 A1* | 7/2005 | Kadowaki | 375/240 |
| 2006/0015789 A1 | 1/2006 | Shin et al. | |
| 2006/0039409 A1 | 2/2006 | Lampinen | |
| 2006/0156184 A1* | 7/2006 | Kim et al. | 714/758 |
| 2007/0047499 A1* | 3/2007 | Montojo et al. | 370/335 |
| 2008/0146166 A1* | 6/2008 | Khan et al. | 455/78 |
| 2008/0153425 A1* | 6/2008 | Heo et al. | 455/68 |
| 2008/0165893 A1* | 7/2008 | Malladi et al. | 375/299 |
| 2008/0310360 A1* | 12/2008 | Heo et al. | 370/329 |
| 2008/0320373 A1* | 12/2008 | Kim et al. | 714/790 |
| 2009/0154458 A1 | 6/2009 | Kim et al. | |
| 2009/0175248 A1* | 7/2009 | Kim et al. | 370/336 |
| 2009/0296667 A1* | 12/2009 | Tajima et al. | 370/336 |
| 2010/0046482 A1* | 2/2010 | Sridhara et al. | 370/336 |
| 2010/0098012 A1 | 4/2010 | Bala et al. | |
| 2010/0135181 A1* | 6/2010 | Earnshaw et al. | 370/252 |
| 2010/0157895 A1 | 6/2010 | Pani et al. | |
| 2010/0172433 A1 | 7/2010 | Li et al. | |
| 2010/0195662 A1 | 8/2010 | Kang et al. | |
| 2010/0246604 A1 | 9/2010 | Kim et al. | |
| 2010/0251061 A1 | 9/2010 | Okamura et al. | |
| 2010/0284362 A1* | 11/2010 | Tajima et al. | 370/329 |
| 2011/0010598 A1* | 1/2011 | Wang et al. | 714/748 |
| 2011/0149894 A1 | 6/2011 | Luo et al. | |
| 2011/0182277 A1* | 7/2011 | Shapira | 370/338 |
| 2011/0205981 A1* | 8/2011 | Koo et al. | 370/329 |
| 2011/0249578 A1* | 10/2011 | Nayeb Nazar et al. | 370/252 |
| 2011/0268045 A1 | 11/2011 | Heo et al. | |
| 2011/0269490 A1 | 11/2011 | Earnshaw et al. | |
| 2011/0274059 A1 | 11/2011 | Brown et al. | |
| 2011/0286544 A1 | 11/2011 | Avudainayagam et al. | |
| 2012/0020434 A1 | 1/2012 | Callard et al. | |
| 2012/0033587 A1* | 2/2012 | Papasakellariou et al. | 370/277 |
| 2012/0082075 A1 | 4/2012 | Luo et al. | |
| 2012/0099545 A1 | 4/2012 | Han et al. | |
| 2012/0113831 A1 | 5/2012 | Pelletier et al. | |
| 2012/0210187 A1* | 8/2012 | Yin et al. | 714/751 |
| 2013/0116002 A1* | 5/2013 | Kim et al. | 455/522 |

FOREIGN PATENT DOCUMENTS

| | | | |
|---|---|---|---|
| EP | 1895666 A1 | 8/2007 | |
| WO | 9740582 A1 | 10/1997 | |
| WO | 01/41314 A1 | 6/2001 | |
| WO | 2009/134913 A1 | 11/2009 | |

OTHER PUBLICATIONS

PCT application No. PCT/US2010/052075, International Search Report mailed Jan. 19, 2011, 4 pages.
PCT application No. PCT/US2010/052075, Written Opinion of the International Searching Authority mailed Jan. 19, 2011, 7 pages.
3GPP TS 36.212 V9.0.0, "Technical Specification Group Radio Access Network; Evolved Universal Terrestrial Radio Access (E-UTRA); Multiplexing and channel coding (Release 9)" (in particular, sections 5.2.3, 5.2.2.6, 5.1.4.2.1, 5.1.4.2.2), Dec. 2009, 61 pages.
3GPP TS 36.213 V10.2.0, "Technical Specification Group Radio Access Network; Evolved Universal Terrestrial Radio Access (E-UTRA); Physical layer procedures (Release 10)" (in particular, section 5.1.2.1), Jun. 2011, 120 pages.
Ericsson, ST-Ericsson: 3GPP TSG-RAN WG1 #66, "Periodic CSI and A/N reporting for CA" Agenda Item: 7.2.1.2, Zhuhai, China, Oct. 10-14, 2011, R1-112921, 3 pages.
InterDigital Communications, LLC: 3GPP TSG-RAN WG1 #66bis, "Multiplexing CSI and A/N using PUCCH F3" Agenda Item: 7.2.1.2, Zhuhai, China, Oct. 10-14, 2011, R1-113218, 9 pages.
PCT application No. PCT/US12/59979, International Search Report and Written Opinion of the International Searching Authority mailed Feb. 8, 2013, 10 pages.
Notice of Allowance dated Mar. 6, 2014; U.S. Appl. No. 13/268,255, filed Oct. 7, 2011; 16 pages.
3GPP TR 25.814 V7.0.0; 3rd Generation Partnership Project; Technical Specification Group Radio Access Network; Physical Layer Aspects for Evolved Universal Terrestrial Radio Access (UTRA); Release 7; Jun. 2006; 126 pages.
3GPP TSG RAN WG1 Meeting #61; "A/N Codebook Design with DTX for Carrier Aggregation"; R1-103088; Montreal, Canada; May 10-14, 2010; 11 pages.
3GPP TSG-RAN WG1 #60bis; "On ACK/NACK Codebook Performance for Carrier Aggregation"; R1-101787; Beijing, China; Apr. 12-16, 2010; 19 pages.
3GPP TSG RAN WG1 Meeting #62; "Equalization of ACK/NAK Bit Performance in LTE-A"; R1-104314; Madrid, Spain; Aug. 23-27, 2010; 3 pages.
Office Action dated Sep. 26, 2013; U.S. Appl. No. 13/268,255, filed Oct. 7, 2011; 19 pages.
Buckley, Michael Eoin, et al.; U.S. Appl. No. 13/268,255, filed Oct. 7, 2011; Title: Message Rearrangement for Improved Wireless Code Performance.
Buckley, Michael Eoin, et al.; U.S. Appl. No. 14/266,344, filed Apr. 30, 2014; Title: Message Rearrangement for Improved Wireless Code Performance.
Kim, Joon Beom, et al.; U.S. Appl. No. 13/787,479, filed Mar. 6, 2013; Title: Method and System for Uplink HARQ and CSI Multiplexing for Carrier Aggregation.
3GPP TS 36.211 V10.1.0; 3rd Generation Partnership Project; Technical Specification Group Radio Access Network; Evolved Universal Terrestrial Radio Access (E-UTRA); Physical Channels and Modulation; Release 10; Mar. 2011; 104 pages.
3GPP TS 36.212 V10.1.0; 3rd Generation Partnership Project; Technical Specification Group Radio Access Network; Evolved Universal Terrestrial Radio Access (E-UTRA); Multiplexing and Channel Coding; Release 10; Mar. 2011; 77 pages.
3GPP TS 36.213 V10.1.0; 3rd Generation Partnership Project; Technical Specification Group Radio Access Network; Evolved Universal Terrestrial Radio Access (E-UTRA); Physical Layer Procedures; Release 10; Mar. 2011; 115 pages.
Divsalar, Dariush, et al.; "Coding Theorems for 'Turbo-Like' Codes"; Proc. 36th Allerton Conf. on Communication; Control and Computing; Allerton, Illinois; Sep. 1998; 10 pages.
PCT International Search Report; Application No. PCT/US2013/029416; May 7, 2013; 5 pages.
PCT Written Opinion of the International Searching Authority; Application No. PCT/US2013/029416; May 7, 2013; 7 pages.
Office Action dated Oct. 10, 2014; U.S. Appl. No. 14/266,344, filed Apr. 30, 2014; 15 pages.
Notice of Allowance dated Dec. 23, 2014; U.S. Appl. No. 14/266,344 filed Apr. 30, 2014; 8 pages.
Office Action dated Dec. 5, 2014; U.S. Appl. No. 13/787,479, filed Mar. 6, 2013; 38 pages.
Canadian Office Action; Application No. 2,814,069; Mar. 11, 2015; 3 pages.

* cited by examiner

METHOD AND SYSTEM FOR UP-LINK HARQ-ACK AND CSI TRANSMISSION

FIELD OF THE DISCLOSURE

The present disclosure relates to uplink communication from a user equipment (UE) and in particular relates to uplink communications of acknowledgements or negative acknowledgements along with a channel state indication payload.

BACKGROUND

On receiving a communication transmission from a network element, the user equipment may be required to provide the network with an indication to either acknowledge or negatively acknowledge receipt of the data packet. In particular, an acknowledgement (ACK) would indicate to the network that the packet was successfully received and decoded, and that the next packet for the user equipment may be sent. Conversely, a negative acknowledgement (NACK) would indicate to the network that the data packet previously sent was not successfully decoded.

A user equipment may also be required to send channel state information (CSI) to the network periodically to indicate to the network the state of the channel. Such channel state information may include, for example, a channel quality indicator (CQI), a precoding matrix indicator (PMI) and/or a rank indicator (RI), among others. In the Third Generation Partnership Project (3GPP) Long Term Evolution (LTE) Release 10 specifications, a user equipment (UE) is configured to transmit a Hybrid Automatic Repeat Request (HARQ)-ACK on the physical uplink control channel (PUCCH) format 3. A periodic CSI may be dropped if HARQ-ACK and the periodic CSI happen to be transmitted in the same subframe. The CSI dropping is a simple approach to handle simultaneous transmission. However, excessive CSI dropping, which may result from a steady flow of downlink traffic requiring HARQ-ACK information to be transmitted on the uplink, may degrade the downlink throughput because the evolved Node B (eNB) scheduler does not receive timely CSI reports.

BRIEF DESCRIPTION OF THE DRAWINGS

The present disclosure will be better understood with reference to the drawings, in which.

DETAILED DESCRIPTION

Figure 1:
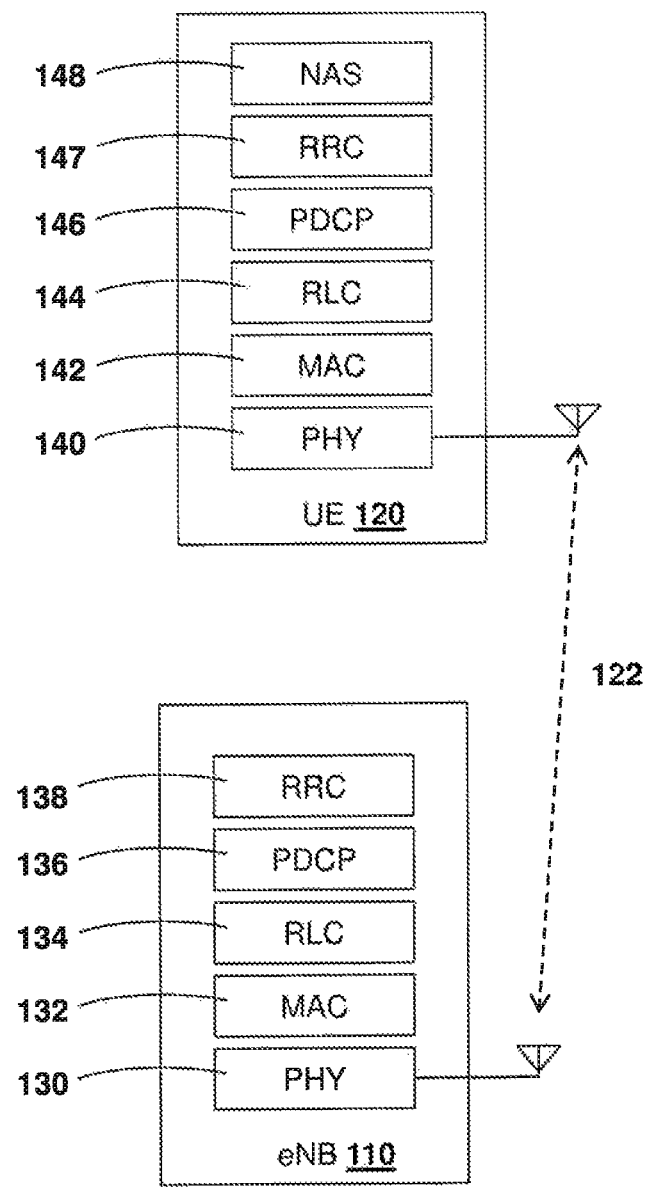
FIG. 1 is a schematic diagram showing an example protocol stack in a wireless communication system.

The present disclosure provides a method for simultaneous transmission of a first set of information bits and a second set of information bits by a user equipment, the method comprising: separately encoding the first set of information bits and the second set of information bits; and transmitting the encoded first set of information bits at a different transmission power than the encoded second set of information bits.

The present disclosure further provides a user equipment comprising: a processor; and a communications subsystem, wherein the processor and communications subsystem cooperate to: separately encode a first set of information bits and a second set of information bits; and transmit the encoded first set of information bits at a different transmission power than the encoded second set of information bits.

The present disclosure further provides a method for simultaneous transmission of a first set of information bits and a second set of information bits by a user equipment, the method comprising: separately encoding, utilizing linear block encoders, the first set of information bits and the second set of information bits; applying a first rate matching to the encoded first set of information bits, a parameter of the first rate matching being chosen from a value representing the minimum of an upper limit and a second value, the second value calculated by multiplying the number of first information bits by a bias value; using a second rate matching for the encoded second set of information bits, a parameter of the second rate matching determined by a predefined value minus the first rate matching value; and transmitting the encoded rate-matched first set of information bits and the encoded rate-matched second set of information bits.

The present disclosure further provides a user equipment comprising: a processor; and a communications subsystem, wherein the processor and communications subsystem cooperate to: separately encode, utilizing linear block encoders, a first set of information bits and a second set of information bits; apply a first rate matching to the encoded first set of information bits, a parameter of the first rate matching being chosen from a value representing the minimum of an upper limit and a second value, the second value calculated by multiplying the number of first information bits by a bias value; use a second rate matching for the encoded second set of information bits, a parameter of the second rate matching determined by a predefined value minus the first rate matching value; and transmit the encoded rate-matched first set of information bits and the encoded rate-matched second set of information bits.

The present disclosure further provides a method for simultaneous transmission of a first set of information bits and a second set of information bits by a user equipment, the method comprising: distributing the first set of information bits between a first bit vector and a second bit vector and distributing the second set of information bits between the first bit vector and the second bit vector; separately encoding the first bit vector into a first codeword and encoding the second bit vector into a second codeword; and transmitting the first codeword and second codeword.

The present disclosure further provides a user equipment comprising: a processor; and a communications subsystem, wherein the processor and communications subsystem cooperate to: distribute a first set of information bits between a first bit vector and a second bit vector and distribute a second set of information bits between the first bit vector and the second bit vector; separately encode the first bit vector into a first codeword and encode the second bit vector into a second codeword; and transmit the first codeword and second codeword.

The present disclosure further provides a method for simultaneous transmission of a first set of information bits and a second set of information bits by a user equipment, the method comprising: first encoding the first set of information bits; further encoding the encoded first set of information bits with the second set of information bits; and transmitting the further encoded bits.

The present disclosure further provides a user equipment comprising: a processor; and a communications subsystem, wherein the processor and communications subsystem cooperate to: first encode a first set of information bits; further encode the encoded first set of information bits with a second set of information bits; and transmit the further encoded bits.

The present disclosure further provides a method for simultaneous transmission of a first set of information bits and a second set of information bits by a user equipment, the method comprising: separately encoding the first set of information bits and the second set of information bits; modulating the encoded first set of information bits and the encoded second set of information bits to create modulated symbols; mapping the modulated symbols of the encoded first set of information bits adjacent to a reference symbol; mapping the modulated symbols of the encoded second set of information bits to remaining symbols; and transmitting the encoded first set of information bits and the encoded second set of information bits.

The present disclosure further provides a user equipment comprising: a processor; and a communications subsystem, wherein the processor and communications subsystem cooperate to: separately encode a first set of information bits and a second set of information bits; modulate the encoded first set of information bits and the encoded second set of information bits to create modulated symbols; map the modulated symbols of the encoded first set of information bits adjacent to a reference symbol; map the modulated symbols of the encoded second set of information bits to remaining symbols; and transmit the encoded first set of information bits and the encoded second set of information bits.

The present disclosure relates generally to data transmission in communication systems and, more specifically, to methods and systems for control information transmission in networks and devices implementing carrier aggregation.

Reference is now made to FIG. 1, which shows a simplified architecture for communication between various elements in a system for the control plane. A similar protocol stack exists for the user plane. In the following the control plane protocol stack is used as an example. In particular, eNB 110 provides cell coverage to a first area and may serve a UE 120, which communicates with eNB 110 through wireless communication link 122.

As shown in the example of FIG. 1, each element includes a protocol stack for the communications with other elements. In the case of eNB 110, the eNB includes a physical layer 130, a medium access control (MAC) layer 132, a radio link control (RLC) layer 134, a packet data convergence protocol (PDCP) layer 136 and a radio resource control (RRC) layer 138.

In the case of UE 120, the UE includes a physical layer 140, a MAC layer 142, an RLC layer 144, a PDCP layer 146, an RRC layer 147 and a non-access stratum (NAS) layer 148.

Communications between the entities, such as between eNB 110 and UE 120, generally occur within the same protocol layer between the two entities. Thus, for example, communications from the RRC layer at eNB 110 travels through the PDCP layer, RLC layer, MAC layer and physical layer and get sent over the physical layer to UE 120. When received at UE 120, the communications travel through the physical layer, MAC layer, RLC layer, PDCP layer to the RRC level of UE 120. Such communications are generally done utilizing a communications sub-system and a processor, as described in more detail below.

The present disclosure is provided below with regards to a 3GPP LTE architecture. However, the present disclosure is not limited to such architecture and other communications systems could equally be utilized in employing the embodiments provided herein. The present disclosure is thus not limited to 3GPP LTE.

ACK/NACK

In 3GPP LTE, prior to a data transmission on the physical downlink shared channel (PDSCH) in a subframe, the eNB encodes control information on the physical downlink control channel (PDCCH) which is transmitted in the control region. In one embodiment, the control region may consist of up to 4 Orthogonal Frequency Division Multiplex (OFDM) symbols at the beginning of a subframe.

A UE attempts PDCCH decoding at the start of each subframe. Once the UE detects a PDCCH containing PDSCH scheduling information for the UE, the UE performs PDSCH decoding according to the scheduling information included in a detected PDCCH. If a cyclic redundancy check (CRC) of the PDSCH data is successful, the UE transmits an ACK on the physical uplink control channel (PUCCH). In one case, the ACK may be transmitted on the 4th subframe after the PDSCH reception. Alternatively, the ACK transmission may be even later depending on the configuration if the system is time division duplex (TDD). While HARQ-ACK and CSI can be transmitted via Physical Uplink Shared Channel (PUSCH) in certain scenarios, the present disclosure uses transmissions of HARQ-ACK and CSI over PUCCH as an example.

If the CRC check of the PDSCH data is not successful, the UE can transmit a NACK on the PUCCH to request a retransmission. Typically if no PDCCH is detected by a UE for frequency division duplex (FDD) in LTE Rel-8 specifications, then no acknowledgement, either positive or negative, is indicated on the uplink PUCCH. This is referred to as discontinuous transmission (DTX). While ideally three HARQ responses (ACK, NACK, DTX) are possible, to simplify the transmission it is also possible to use two HARQ responses (ACK, NACK) for a data packet where DTX and NACK are both represented by NACK. Thus only one bit is needed to represent the HARQ response. For example, each positive acknowledgement (ACK) is encoded as a binary '1' and each negative acknowledgement (NACK) is encoded as a binary '0'. In LTE, a PDSCH may carry one or two transport blocks (TBs). Each TB on the downlink needs one HARQ-ACK bit in response on the uplink. Thus a PDSCH transmission requires one or two HARQ-ACK bits in response, depending on the number of TBs carried by the PDSCH.

In LTE, carrier aggregation may be used in order to support a wider transmission bandwidth for increased potential peak data rates. In carrier aggregation, multiple component carriers (CCs) are aggregated and can be allocated in a subframe to a UE. Thus, each component carrier may have a bandwidth of, for example, 20 MHz and a total aggregated system bandwidth could reach 100 MHz when five component carriers are aggregated. The UE may receive or transmit on multiple component carriers depending on its capabilities. Further, carrier aggregation may occur with carriers located in the same band and/or carriers located in different bands. For example, one carrier may be located at 2 GHz band and a second aggregated carrier may be located at 800 MHz band.

Currently, a UE may receive on a multiple of up to five downlink component carriers, depending on the UE's capabilities and deployment scenario. Multiple PDSCHs can be scheduled to one UE in the same subframe, but on different carriers, and multiple PDSCHs may be decoded in parallel.

In order to save UE battery power, one example of signaling includes the UE transmitting multiple ACKs or NACKs on one PUCCH in the uplink primary component carrier (PCC).

As a potential mismatch could arise between the UE and eNB understandings of the HARQ-ACK payload size if a transmitted PDCCH is not detected by the UE, the HARQ-ACK payload size is based on the number of configured CCs and configured transport blocks (TBs) per component carrier. Therefore the HARQ-ACK payload size is not dependent on the successful decoding of all PDCCH messages and hence remains constant in a semi-static sense. In other words, the HARQ-ACK payload size does not change dynamically. Since the number of configured CCs is given by radio resource control (RRC) signaling, the RRC signaling is required to change the number of CCs. In a TDD system, the number of HARQ-ACK bits can be determined by both the number of configured CCs and the downlink (DL) or uplink (UL) subframe ratio or the value in the downlink assignment index (DAI) information to support the case when the HARQ-ACK bits of multiple downlink subframes are transmitted in one uplink subframe.

When the number of HARQ-ACK bits is determined based on the number of configured CCs and the number of configured transport blocks per configured CC, if a PDCCH is received on at least one of the configured CCs, then NACKs are sent for all other CCs on which no PDCCH has been detected. If a PDCCH is detected then the UE makes an attempt to receive the corresponding PDSCH data. If the PDSCH decoding is successful, the UE sends a positive acknowledgement message to the eNB and otherwise a negative acknowledgement is indicated. In the case of a CC being configured for dual-transport block transmission, two HARQ-ACK bits per subframe may be used for that CC, whereas for a carrier configured for a single transport block only one HARQ-ACK bit per subframe may be necessary.

Figure 2:
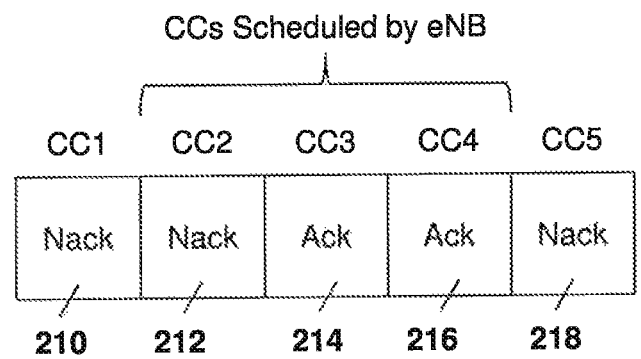
FIG. 2 is a schematic diagram showing an example ACK/NACK transmission.

Reference is now made to FIG. 2. As shown in FIG. 2, a UE receives data from five component carriers, namely component carriers 210, 212, 214, 216 and 218 respectively.

In a particular subframe, the component carriers 212, 214 and 216 are scheduled by an eNB to send data to a UE. In this case, the eNB will indicate via the PDCCH that component carriers 212, 214 and 216 have data and the UE will then try to decode component carriers 212, 214 and 216.

Component carriers 210 and 218 are not used in the subframe. For the HARQ response, the UE signals an ACK or an NACK for component carriers 212, 214 and 216 depending on whether or not the decoding of the PDSCH was successful for those component carriers. For component carriers 210 and 218, the UE will send a NACK to represent DTX.

Thus, an eNB will have a priori knowledge for the response of component carriers 210 and 218. In particular, the eNB knows which component carriers and subframes PDCCH and PDSCH transmissions did not occur on and thus has a priori knowledge that NACKs will be indicated for those resources provided at least one PDCCH and therefore one PDSCH was scheduled in the subframe. If no information was scheduled in the subframe then the UE is expected to send NACK (=DTX) and not expected to transmit an ACK in the HARQ response.

Thus, a UE will signal NACKs for both the case of a non-detection of a PDCCH and the case of an unsuccessful PDSCH decoding when a PDCCH was detected. However, the detection in the eNB can utilize the a priori knowledge that any HARQ-ACK bits corresponding to component carriers and subframes where a PDCCH was not transmitted must have a value of "NACK".

CSI

As defined in section 5.2.2.6.4 of the 3GPP Technical Specification (TS) 36.212, V.9.0.0, "Technical Specification Group Radio Access Network; Evolved Universal Terrestrial Radio Access (E-UTRA); Multiplexing and channel coding (Release 9)", the contents of which are incorporated herein by reference, CSI transmitted on the physical uplink control channel is coded using a single Reed-Muller (RM) code in 3GPP LTE Rel-8 and Rel-9. The Reed-Muller code is a linear error correcting code used in communications. In the case of the 3GPP TS 36.212, the Reed-Muller code can be used with a 32-bit code word with a payload up to 11 bits. In other embodiments, the CSI transmitted on the PUCCH is coded using a single Reed-Muller code (20, A) for payload sizes up to 13 bits.

The encoding with an RM code provides a decreasing reliability for the information bits and an increasing bit error probability as the information bits move from the most significant bit to the least significant bit.

Figure 3:
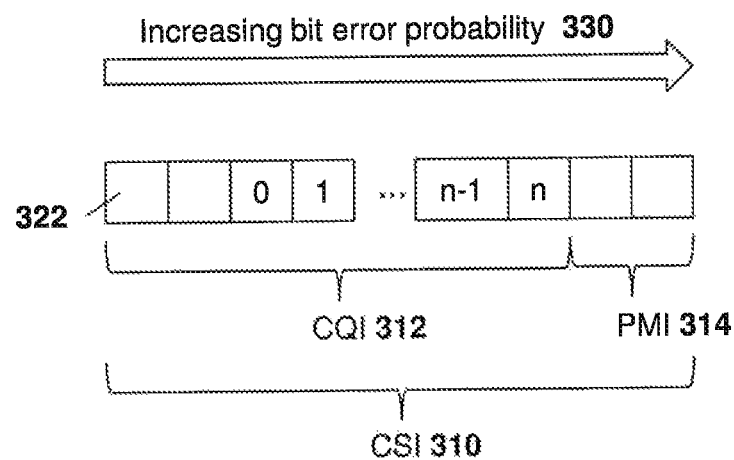
FIG. 3 is a schematic diagram showing CSI payload ordering in LTE.

In particular, as shown in FIG. 3, the CSI 310 includes the CQI 312 and PMI 314. The RM encoded bits 322 are shown from the most significant bit to the least significant bit of the CQI and with the PMI appended thereto. As shown by arrow 330, increased bit error probability occurs when moving from the most significant bit to the least significant bit of the CQI and to the PMI.

Thus, the payload ordering for the CQI portion of the CSI message is the order of the most significant bit to the least significant bit of the CQI message. This ordering complements the unequal bit error probability characteristics present on RM codes where the most significant information bit of the encoded message is less likely to be in error than the least significant information bit since the most significant bits of a CQI message have a greater impact in an erroneous CQI report than the least significant bits. However, in some embodiments the PMI has greater sensitivity to error, but still occupies the least significant bit positions which are the most likely impacted by decoder failure in a Rel-8 LTE system.

In a Rel-10 LTE system, dual Reed-Muller coding is used when the number of HARQ-ACK bits is more than 11 bits. This is to allow a large number of HARQ-ACK bits to be transmitted in the case where multiple carriers are aggregated. This may be most common, for example, in the case of TDD where up to 40 HARQ-ACK bits could be required, assuming 5 carriers are aggregated and 4 subframes are scheduled with two transport blocks per carrier for TDD uplink/downlink configuration 2. However, since such large HARQ-ACK signaling can cause a burden in control signaling, a limit of up to 20 HARQ-ACK bits to be transmitted may be used and spatial bundling may be applied when the number of HARQ-ACK bits is more than 20.

Since the RM coding used for CSI transmission supports up to 11 bits, two RM encoders are used to transmit up to 22 bits.

For simplicity, the descriptions below do not include the application of an orthogonal cover sequence and cyclic shift.

However, in application these are applied before a discrete Fourier transform (DFT) processing to transmit HARQ-ACK in PUCCH format 3.

As indicated above, Rel-10 carrier aggregation may cause a periodic CSI to be dropped if HARQ-ACK is transmitted in the same subframe. In the LTE Rel-11 specifications, simultaneous transmission of CSI and HARQ-ACK is proposed when HARQ-ACK is transmitted on PUCCH format 3. In the description below, the uplink transmission focuses on simultaneous transmission of two types of information: HARQ-ACK and CSI. It is appreciated by those skilled in the art that other types of information can be concatenated and/or interleaved on the same uplink transmission as needed by following the same principles. An example of other types of information that can be transmitted simultaneously with HARQ-ACK and CSI is scheduling request (SR).

One possible way to do this is to reuse the dual Reed-Muller coding to increase the payload size that the UE can transmit on PUCCH format 3. As indicated above, the dual RM code can support a payload of up to 22 bits.

In accordance with the embodiments described herein, the encoding of HARQ-ACK is discussed. Three ways for encoding are provided in accordance with the present disclosure. Further, an increase in reliability based on the modulated symbol locations is also provided.

In particular, the three ways of providing encoding discussed include: separate encoding of high reliability information; joint encoding of information with linear block codes; and joint coding with convolutional codes. Each is discussed below.

Separate Encoding

In accordance with one embodiment of the present disclosure, in forming the HARQ-ACK and CSI message payload the HARQ-ACK portion of the payload is encoded by one constituent encoder while the CSI portion is encoded by the remaining constituent encoder. In one embodiment, the constituent encoder is a Reed-Muller encoder, which is a type of linear block code. However, other examples of encoders are possible.

Figure 4:
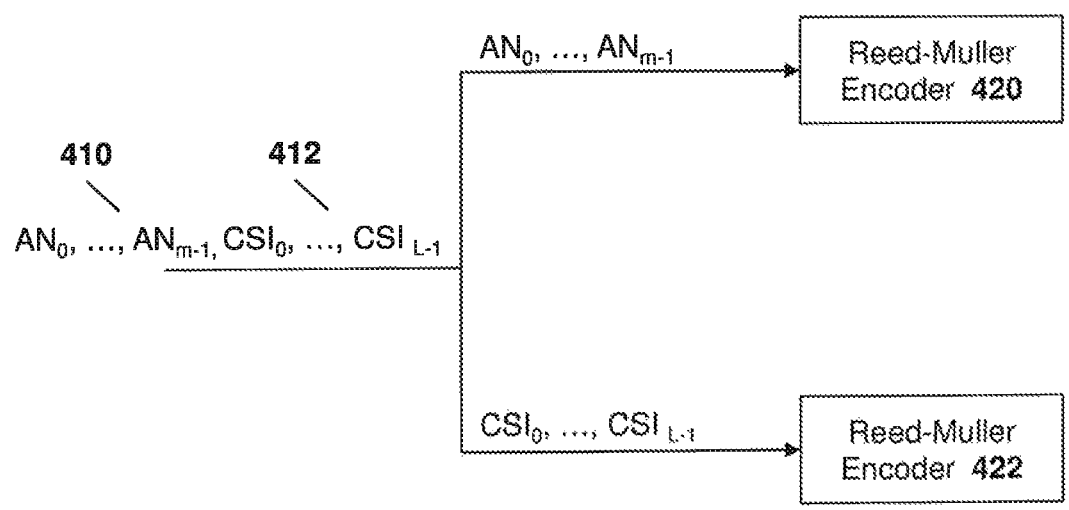
FIG. 4 is a schematic diagram showing an example coding structure for simultaneous HARQ-ACK and CSI transmission.

Reference is now made to FIG. 4. In FIG. 4 HARQ-ACK bits $AN_0$ to $AN_{m-1}$ 410, along with CSI bits $CSI_0$ to $CSI_{L-1}$ 412 are provided to two separate Reed-Muller encoders, namely RM 420 and RM 422.

As seen in the embodiment of FIG. 4, the HARQ-ACK bits are provided to RM 420 and the CSI bits are provided to RM 422.

In one alternative example, one possibility of ordering the CSI information is to place the RI information first, followed by CQI and followed by PMI in the most significant to least significant bits. This provides for enhanced RI reliability.

In accordance with the embodiment of FIG. 4, the approach may lead to unequal payload sizes among the component codes since the number of HARQ-ACK bits may differ from the number of CSI bits. Nevertheless, separately encoding payload types may allow separate control of both control message types.

One advantage of separate control may be flexibility in controlling the respective reliabilities of the HARQ-ACK and CSI information. This is provided below with regard to separate power control for the different encoders or through rate matching for the separate encoders. In a further embodiment, instead of just having HARQ-ACK bits 410 being provided to RM 420, the RI may also be included for the first encoder 420. This provides a block that has bits requiring higher reliability, namely the HARQ-ACK and RI bits, and a block having a regular reliability requirement, namely the remaining CSI bits.

For the power control approach, each RM code word may be transmitted at a different power level. This may be enabled by mapping each RM code word to a different slot in the subframe where PUCCH is transmitted.

Figure 5:
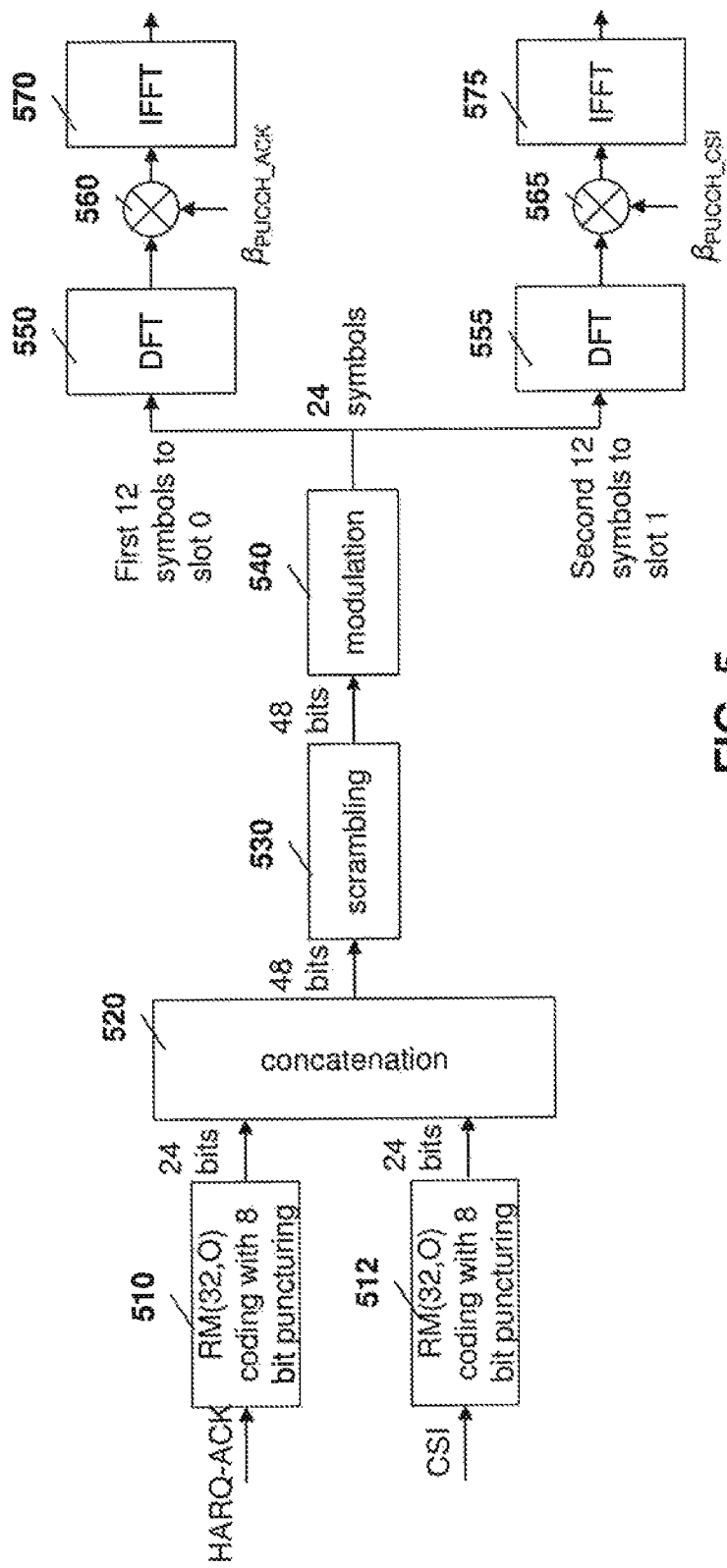
FIG. 5 is a schematic diagram showing a conventional coding structure for HARQ-ACK in TDD.

Reference is now made to FIG. 5 which provides an example of HARQ-ACK and CSI coding utilizing the first approach. In particular, in the example of FIG. 5, HARQ-ACK and CSI are each RM encoded with 8 bits punctured from the length-32 code thus providing codewords of 24 bits. This is shown with blocks 510 and 512.

The output from blocks 510 and 512 are provided to concatenation block 520 which then concatenates the bits and provides a 48-bit output.

The concatenation block output is provided to a scrambling block 530 which provides an XOR with a random sequence to produce 48 bits, which are then modulated at modulation block 540. In the example of FIG. 5, the modulation is quadrature phase shift keying (QPSK) modulation. However, other modulation techniques are possible.

The output from the QPSK modulation block 540 is 24 symbols, which are then divided into the first 12 symbols going to a discrete Fourier transform (DFT) block 550, and the second 12 symbols being provided to a second DFT block 555.

The output from DFT block 550 is then multiplied by a power level for the HARQ-ACK, as shown by block 560. Similarly, the output of DFT block 555 is multiplied by a power level for the CSI, shown at block 565.

The output from the multiplication at block 560 is then provided to an inverse fast Fourier transform (IFFT) block 570 and the output is then sent to the network. In the example of FIG. 5, the output from block 570 is sent over slot 0 of the subframe.

Similarly, the output from multiplication block 565 is provided to the IFFT block 575, and the output of the multiplication is then sent to the network element. In the example of FIG. 5, the output from block 575 is sent over slot 1 of the subframe In an alternative embodiment, instead of providing for concatenation block 520, separate scrambling and modulation blocks 530 and 540 may be provided for the output from each of blocks 510 and 512 respectively.

Since separate DFT processing is applied to each of the encoder 510 based codeword and encoder 512 based codeword after scrambling and QPSK modulation, concatenation of encoder 510 and encoder 512 based codewords simply locates the HARQ-ACK bits first and the CSI bits later to generate the serial bits.

To transmit HARQ-ACK and CSI in each slot, the HARQ-ACK can be delivered in a fixed manner to DFT for slot 0 or slot 1 and the CSI symbols delivered to DFT 555 for slot 1 or slot 0.

Further, in one embodiment, to balance the higher power that is being used for the HARQ-ACK symbols, the HARQ-ACK symbols may be alternated to be sent on slot 0 and slot 1 which averages the interference caused to neighboring cells. As will be appreciated, if there are no sounding reference symbol transmissions in the same subframe, the number of single carrier frequency division multiple access (SC-FDMA) symbols is the same in slot 0 and slot 1, and hence there is no difference even if the CSI symbols are transmitted in slot 0 and the HARQ-ACK symbols are transmitted in slot 1.

After DFT processing, the transmission power is adjusted, as indicated above. In this case, an amplitude scaling factor is multiplied in the output symbols. A different power level $\beta_{PUCCH\_ACK}$ is applied for the ACK symbols than the power level $\beta_{PUCCH\_CSI}$ for the CSI symbols.

In LTE, an amplitude scaling factor is determined in order to conform to the transmit power PUCCH specified in Section 5.1.2.1 of the 3GPP TS 36.213 V10.2.0 "*Technical Specification Group Radio Access Network; Evolved Universal Terrestrial Radio Access (E-UTR); Physical Layer Procedures (Rel-10)*", the entire contents of which are incorporated herein by reference.

In accordance with the above, the power for the PUCCH may be defined for the HARQ-ACK and the CSI separately.

$$P_{PUCCH}(i) = \min \begin{Bmatrix} P_{CMAX,c}(i), \\ P_{0\_PUCCH} + PL_c + h(n_{CQI}, n_{HARQ}, n_{SR}) + \\ \Delta_{F\_PUCCH}(F) + \Delta_{TxD}(F') + g(i) \end{Bmatrix} \quad (1)$$

As shown in Equation 1 above, $h(n_{CQI}, n_{HARQ}, n_{SR})$ is the offset parameter to adjust the power level depending on the actual uplink control information. Since the $h(n_{CQI}, n_{HARQ}, n_{SR})$ parameter is defined for HARQ-ACK transmitted on PUCCH format 3, the equation may be re-used with a boost added to the HARQ-ACK power. In one embodiment, the boost may be 3 dB or more if necessary considering it is transmitted on one slot only.

For CSI, a new equation is also needed. Alternatively, the value for $h(n_{CQI}, n_{HARQ}, n_{SR})$ for the CSI can be semi-statically configured.

As will be appreciated by those in the art having regard to the present disclosure, the use of a higher transmission power for the bits encoded at block 510 than for the bits encoded at block 512 provides for a higher reliability for the bits encoded at block 510. This ensures that certain bits such as the HARQ-ACK bits, and in some cases the RI bits, will have a greater likelihood of being decoded successfully and thus reduces the impact of falsely decoding these bits.

In a second approach under separate encoding, different levels of rate matching can be applied to the constituent code words. In particular, with RM coding, current specifications utilize either 32-bit code words or 24-bit codewords which can be obtained from the length-32 codeword via puncturing. This produces a 24-bit output and thus the combination of the two RM encoders provides for 48 bits. The number of bits of a codeword that are utilized increases the reliability and recoverability of the data that is sent utilizing that codeword. Thus, in accordance with a second approach, a block requiring higher reliability may utilize coding with a larger codeword than the codeword for the remaining normal reliability bits.

For example, assuming an equal number of HARQ-ACK and CSI payload bits, since accurate reception of HARQ-ACK information is of higher importance than accurate reception of CSI, more puncturing could be applied to the CSI based RM constituent code word than the HARQ-ACK based RM constituent code word.

Figure 6:
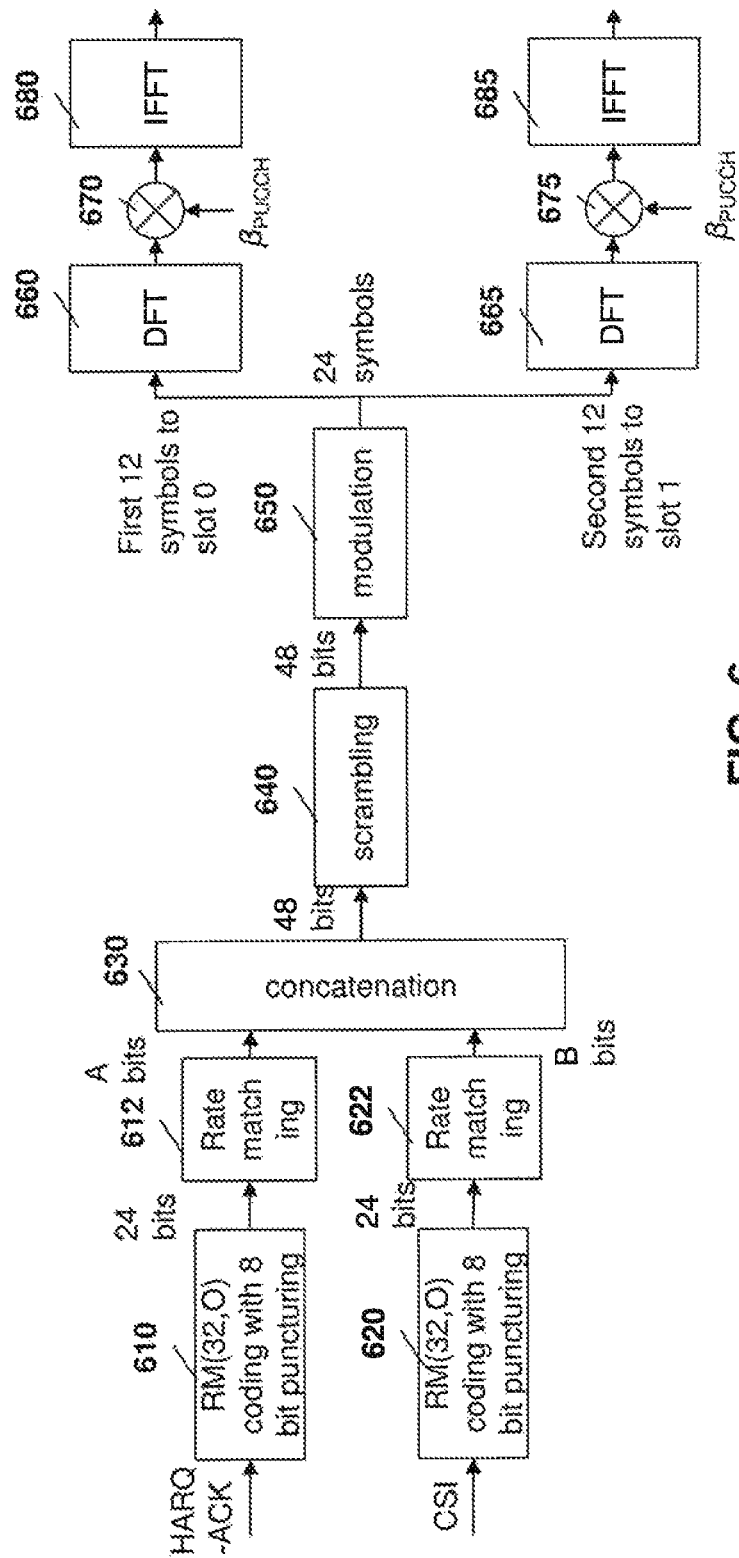
FIG. 6 is a schematic diagram showing an example coding structure of HARQ-ACK and CSI with a different power setting.

Reference is now made to FIG. 6. In FIG. 6, the HARQ-ACK bits are provided to encoder 610, which in the embodiment of FIG. 6 is an RM encoder a having 32-bit codeword.

The 32 bits are then rate matched at block 612 to provide "A" bits output.

Similarly, the CSI bits are provided to RM encoding block 620 which provides for 32-bit coding and then rate matching occurs at block 622, which provides for "B" bits. In one embodiment, A+B=48 and the bits are then concatenated at block 630.

Thus in accordance with FIG. 6, rather than puncturing 8 bits for each encoder, as used in current dual RM coding, HARQ-ACK encoded bits are rate matched as A bits while CSI encoded bits are rate matched at B bits.

In one embodiment, the puncturing may occur by puncturing the last (32—A) bits or (32—B) bits respectively, as used in the current dual RM coding in TDD. If A or B is larger than 32, repetition may be applied. Alternatively, a different puncturing pattern can be applied in some embodiments.

The exact value for A and B could be configured by RRC signaling or predefined considering the difference of reliability between the HARQ-ACK and CSI. A and B could be varied depending on the number of HARQ-ACK and CSI bits. For example, a default value for 1 HARQ-ACK bit may be defined as $A_1$, the number of HARQ-ACK bits is $N_{HARQ-ACK}$, and then the actual value of A can be calculated as:

$$A = A_1 \times N_{HARQ-ACK} \quad (2)$$

A more general form of this equation could be:

$$A = \min\{\text{ceil}(A_0 + A_1 \times N_{HARQ-ACK}), A_2\} \quad (3)$$

Where $A_0$ is a base value. For example, $A_0$ may equal 0 or could be a non-zero integer or floating point value. $A_1$ is a fixed value that may be used to increment the total number of coded bits for HARQ-ACK on a per HARQ-ACK bit basis. $A_1$ could be an integer or floating-point value. In accordance with equation 3, the "ceil" function is used for floating point determinations (since A is necessarily an integer) and in an alternative embodiment a "floor" function could equally be used.

$A_2$ is an upper limit on the number of coded bits which can be used for HARQ-ACK coding. In one embodiment, $A_2 \leq 32$. However, this is not limiting and in other embodiments other values could be provided for $A_2$. Alternatively, if it is allowed to use whole bits for HARQ-ACK transmission, $A_2$ is 48 or $A_2$ value may not be required.

B could then be determined by ensuring the total number of bits is 48, such that B=48−A. This ensures that 24 modulated symbols may be sent in two slots. In other modulation schemes or transmitter schemes, different values than 48 could be utilized.

Referring again to FIG. 6, after the concatenation at block 630, scrambling then occurs at block 640, modulation occurs at block 650 and then each of the symbols is divided into the first 12 symbols and the second 12 symbols.

The first 12 symbols are provided to DFT 660, which are then multiplied by a power value at block 670 and then sent to an IFFT block 680. Similarly, the second 12 symbols are provided to a DFT block 665, a power multiplication block 675 and an IFFT block 685.

The power multiplication at blocks 670 and 675 in the embodiment of FIG. 6 is identical. In one embodiment, the needed puncturing for each constituent RM code could be enabled by taking the 32 bits output of the RM code and using the sub-block interleaver circular buffer rate-matching approach detailed in sections 5.1.4.2.1 and 5.1.4.2.2 of the 3GPP 36.212 V9.0.0, "*Technical Specification Group Radio Access Network; Evolved Universal Terrestrial Radio Access (E-UTRA); Multiplexing and channel coding (Release 9)*", the contents of which are incorporated herein by reference. Generally, two 32-bit codewords are generated, a first for the HARQ-ACK payload and a second for the CSI payload. For each codeword the following rate matching process is applied.

The 32-bit RM output could be read into a sub-block interleaver described in section 5.1.4.2.1 of the TS 36.212 specification. From this buffer, the desired number of codeword bits is read out. If the desired number of codeword bits is greater than 32, the reading wraps around to start from the beginning of the buffer.

Thus, in accordance with the above approach, if 24 bits are needed, the output is read into the sub-block interleaver to provide for the first 24 bits. Conversely, if 40 bits are needed, 32 bits from the circular buffer are read along with the first 8 bits again to form 40 bits.

Based on the above, the HARQ-ACK and CSI are not necessarily transmitted separately in each slot. Therefore, when the HARQ-ACK and CSI are concatenated, interleaving between HARQ-ACK and CSI may be applied to distribute the HARQ-ACK and CSI bits equally as much as possible between the two slots. In this case, the HARQ-ACK bits will form the beginning part of the first RM coding.

In a further embodiment, both of these approaches can be used in parallel with the additional advantage of unequal error protection offered by the Reed Muller codes when ordering the CSI payloads. In particular, since an error has more negative impact on the RI field followed by the PMI field followed by CQI, these fields may follow similar ordering when constructing the CSI payload. The target reliability may continue to focus on the frame error rate (FER). However, to obtain greatest benefit from bit ordering focus should be on the FER of individual fields. For example, if a payload consists of a CQI field and a PMI field, where the PMI field has a $10^{-3}$ FER requirement while the CQI field has a $10^{-2}$ FER requirement, then power control may target the more constrained of these field payload requirements.

Figure 7:
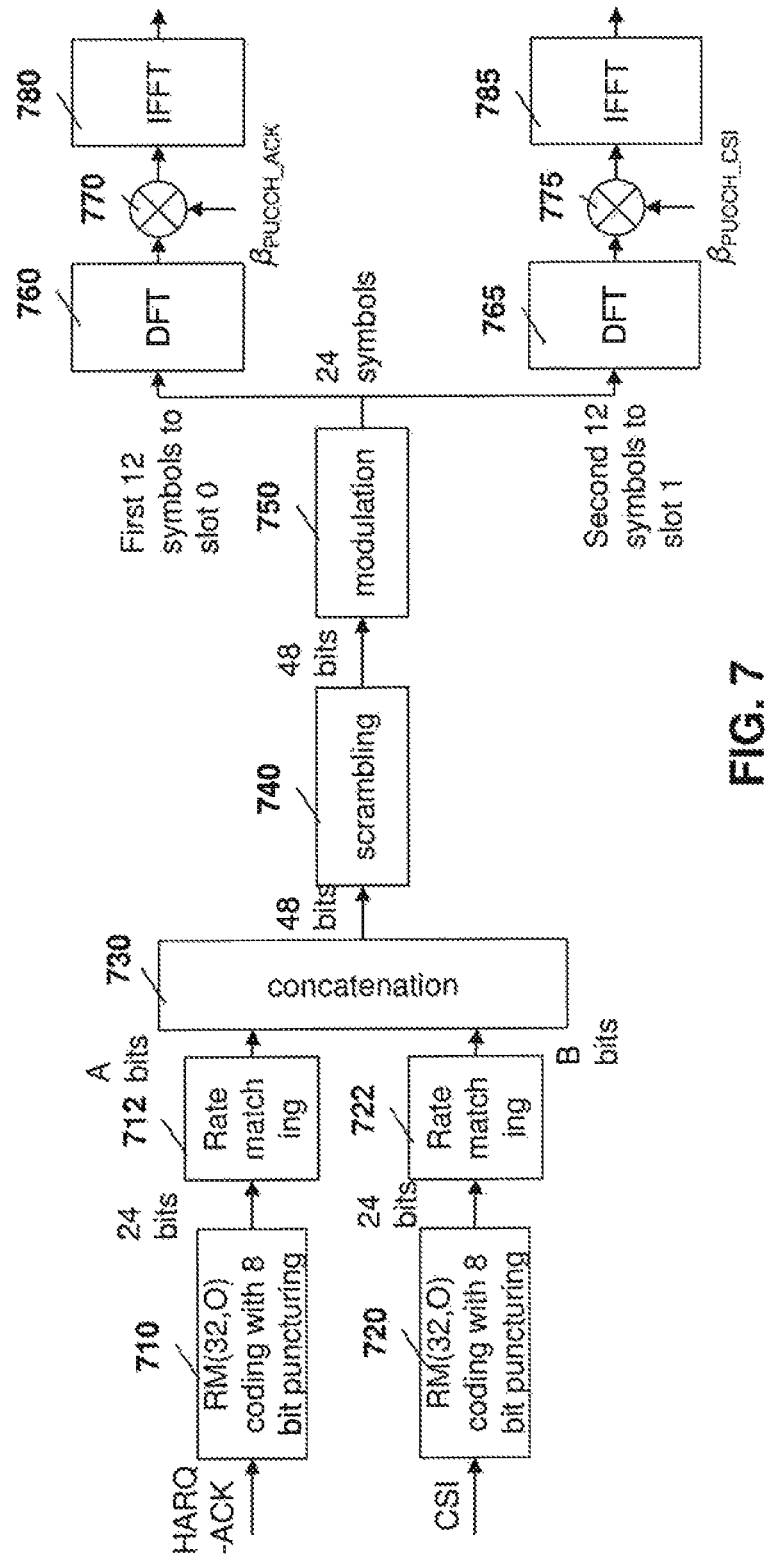
FIG. 7 is a schematic diagram showing an example coding structure of HARQ-ACK and CSI with a different rate matching.

Reference is now made to FIG. 7, which shows the parallel use of the two above approaches. In particular, the HARQ-ACK bits are provided to an RM 32-bit encoder 710 which is then provided with rate matching at block 712. The CSI bits are provided to RM 32-bit encoder 720, which is then provided to rate matching block 722.

The outputs from block 712 and block 722 are provided to a concatenation block 730, and the output from block 730 is then provided to a scrambling block 740. Modulation occurs at block 750 and the first 12 symbols are sent to a DFT block 760 and the second 12 symbols are sent to a DFT block 765.

In a multiplication block 770, the power is set in accordance with the power setting described above with regard to FIG. 5 and then multiplied with the output of block 760.

Similarly, the power for block 775 is found in a similar manner to that of FIG. 5 above and multiplied with the output of block 765.

The output from the multiplier block 770 is provided to IFFT block 780 and the output from multiplication block 775 is provided to IFFT block 785.

Figure 8:
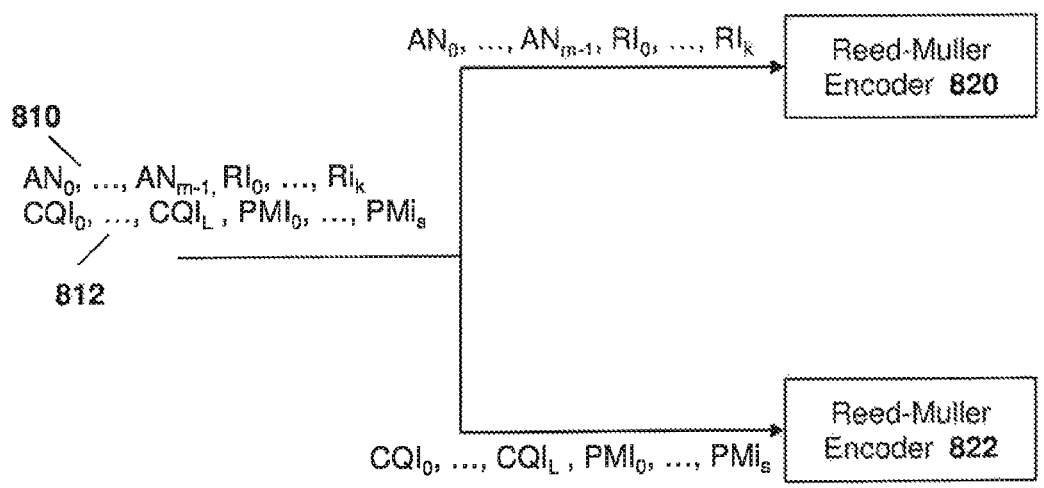
FIG. 8 is a schematic diagram showing an example coding structure of HARQ-ACK and CSI.

In a further embodiment, a generalization of separate coding depending on payload target reliability requirements may be made. For example, if the HARQ-ACK field has a similar requirement for reliability as the RI field but has requirements different from the CQI and PMI, then one configuration may be to form one RM code word from HARQ-ACK and RI bits and a second RM code word from CQI and PMI bits. This is shown below with regard to FIG. 8. Specifically, as seen FIG. 8, the HARQ-ACK bits and the RI bits are provided as input 810 and the CSI and PMI bits are provided as input 812.

The input 810 is provided to RM1 820 and the input 812 is provided to RM2 822.

Joint Encoding

In a further embodiment, the HARQ-ACK and CSI may be jointly encoded within each component RM code. In generating the HARQ-ACK and CSI message payload, it is possible to distribute unknown HARQ-ACK bits as evenly as possible between the two constituent codes. Assuming that the HARQ-ACK bits are ordered sequentially within the vector $x_i$, the goal may be achieved through an odd/even reordering as indicated in FIG. 9, and specified in section 5.2.2.6 of the 3GPP TS 36.212 V9.0.0 technical standard.

Figure 9:
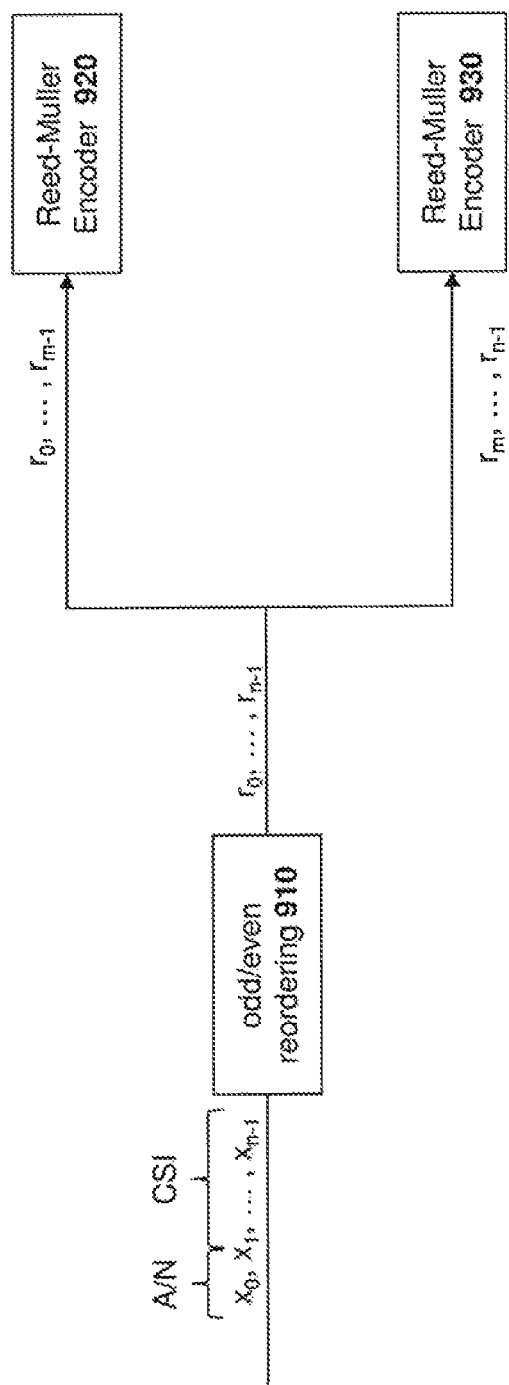
FIG. 9 is a schematic diagram showing an example ordering and coding structure for HARQ-ACK and CSI based on joint coding.

Referring to FIG. 9, the HARQ-ACK and CSI are placed together and ordered from $x_o$ to $x_{n-1}$. The input is then provided to an odd/even reordering block 910.

The bits are then reordered and provided in a stream $r_o$ to $r_{n-1}$, which is then divided. Bits $r_0, \ldots, r_{m-1}$ are provided to first RM encoder 920. Further, bits $r_m$ to $r_{n-1}$ are provided to RM encoder 930.

For example, if there are two HARQ-ACK bits and two CSI bits then these might be placed as HARQ-ACK bit 1, HARQ-ACK bit 2, CSI bit 1 and CSI bit 2 as the input to block 910. After block 910, HARQ-ACK bit 1, CSI bit 1, HARQ-ACK bit 2, CSI bit 2 is the ordering of the bits and these are then divided between encoders 920 and 930. In this way, the HARQ-ACK bits are provided as the most significant bits to the RM encoders 920 and 930, whereas the CSI bits are provided in less significant bit order.

A further advantage of the above is that more balance is achieved in the number of message bits to be decoded between the two constituent decoders. That is the decoder at the eNB may have a priori knowledge of some of the various HARQ-ACK bits are described above. These HARQ-ACK bits correspond to CCs on which no PDCCH was transmitted. The decoder will know the value of these bits and thus will be able to choose a decoded codeword more accurately.

Further, by having the HARQ-ACK bits split between two encoders, the ACK bits are transmitted on different slots yielding more frequency diversity and hence better performance.

While block 910 provides for odd/even reordering, other types of reordering could be used and the present disclosure is not meant to be limited to odd and even reordering only.

Thus, when the HARQ-ACK and CSI are to be transmitted simultaneously, both are multiplexed to construct one payload for joint encoding. As shown in FIG. 9, the coding structure with this approach is provided.

A separate and second goal of such encoding is to take advantage of the unequal error protection of the constituent RM payload bits. In particular, since the reliability of the i-th message bit of an RM code decreases for increasing values of i, it follows that the payload types of greater importance may be located in positions of smaller i in some embodiments. Thus, for example, the HARQ-ACK bits or the RI bits may, in some embodiments, be placed before the CQI and PMI bits. However, in other embodiments various other types of ordering may be provided.

In particular, a first ordering of bits may be the HARQ-ACK bits followed by the RI bits, followed by the PMI bits followed by the CQI bits. Here, it is assumed that the HARQ-ACK information is the most sensitive to an error and the CSI information fields may be then ordered based on a sensitivity to bit error events. In particular, the ordering may be appropriate since robust HARQ-ACK and RI operation may be needed for functional system operation while CQI and PMI are of less importance.

In a second ordering scheme, the RI bits may be followed by the HARQ-ACK bits, which may be then followed by the PMI bits, which then may be followed by the CQI bits. The CSI information fields are again ordered based on sensitivity to bit error events. If other fields have more sensitivity to bit error events then the CSI fields may be reordered. In the case of the second ordering, the HARQ-ACK is placed after the RI field under the assumption that there is likelihood that some CCs are not scheduled and therefore some a priori information may exist. The likelihood of successful decoding can be increased by increasing the likelihood that such a priori information occupies some of the less reliable payload bits.

In a third ordering, the RI is followed by the PMI, which is then followed by the HARQ-ACK bits, which are then followed by the CQI bits. The CSI information fields are again ordered based on sensitivity to bit error events. However, in the case of the third ordering, the HARQ-ACK is placed after the RI and PMI fields under the assumption that there is a likelihood that some CCs are not scheduled and therefore some a priori information exists. The likelihood of successful decoding can be increased by increasing the likelihood that such a priori information occupies some of the less reliable payload bits.

In a fourth ordering embodiment, the RI is followed by the PMI which is followed by the CQI which is followed by the HARQ-ACK bits. In this case, the CSI information fields are ordered based on the sensitivity to bit error events. However, here the HARQ-ACK is placed after all of the CSI information fields under the assumption there is some likelihood that some CCs are not scheduled and therefore some a priori information exists. The likelihood of successful decoding can be increased by increasing the likelihood that such a priori information occupies some of the less reliable payload bits.

In a fifth ordering example, the order of the HARQ and the CSI fields can be configured through higher layer signaling. For example, an indicator may be sent to the UE from the eNB to use a specific ordering or the UE may send an indicator on the PUCCH to indicate the ordering. In one embodiment, the ordering may utilize a bitmap to map the various possible ordering options. Other options for signaling are possible.

In one embodiment, a bit field may only provide two possibilities. In this case, a single bit may be used to indicate the ordering. For example, if the bit is set to TRUE, then the HARQ-ACK is set to higher priority than the CSI and if the bit is set to FALSE then the CSI is ordered first and the HARQ-ACK is ordered second.

In accordance with the above, if the RI, PMI and/or CQI are not transmitted because they are configured in a different subframe, there is no need to reserve payload bits for such CSI signaling. In other words, taking ordering example one from the above as an example, if only the HARQ-ACK and CQI are transmitted, the HARQ-ACK is located from $x_0$ and then the CQI is located after the HARQ-ACK. Thus, the RI and PMI would not be sent in such a scenario.

Furthermore, CCs configured with two TBs have slightly greater tolerances to error events than CCs configured with one TB only. In particular, only one of the two available HARQ-ACK bits needs to be an ACK in order to successfully indicate successful decoding of the PDCCH. Therefore given an ACK was sent, only an ACK to NACK/DTX error event is possible in the case a CC is configured with a single TB whereas an ACK-NACK error event is also possible in the case a CC is configured with two TBs. Since a DTX requires greater resources for retransmission, this infers that the HARQ-ACK bits corresponding to the CCs with a single TB may be located in more reliable payload positions.

Joint Coding

The (32,O) RM code can take a maximum of 11 information bits. With dual RM codes, up to 22 bits can be encoded. If up to 20 bits are dedicated to HARQ-ACK, then there is not enough space to carry the CSI bits.

Additionally, as the total number of information bits increases, relative performance of RM codes compared to other types of coding techniques degrades. In LTE, tail-biting convolutional codes have been defined. Tail-biting convolutional codes are used to protect CQI/PMI reports on the PUSCH when the CQI/PMI report is for more than one downlink cell and the payload sizes are greater than 11 bits.

Thus, if HARQ-ACK feedback and the CSI are concatenated into a relatively large payload for joint coding, the coding scheme may need to change to convolutional codes. The concatenated bits can be processed with CRC attachment, tail-biting convolutional code encoding, and circular-buffer rate matching.

To reduce the payload size, a new CRC polynomial may be chosen with L=4 instead of L=8, for example.

To support a larger payload size, the uplink physical channel can either be:
 (1) A PUCCH with larger resources. The current PUCCH format 3 can transmit up to 22 bits. However, if higher order modulation (QAM) or smaller spreading factors than 4 are used, then more bits can be transmitted in PUCCH format 2; or
 (2) PUSCH without data payload may be used which is scheduled semi-persistently.

In order to provide more protection for HARQ-ACK bits, additional encoding for the HARQ-ACK bits may be used. In other words, the HARQ-ACK bits are first encoded and the coded bits are then jointly encoded with the CSI bits using a convolutional code. The encoding for HARQ-ACK bits can be added with a very simple code, such as a CRC code. In this way, with a few CRC bits, the level of protection on the HARQ-ACK bits is increased. If the total number of CRC-coded HARQ-ACK bits and CSI bits does not exceed the number of bits that the dual RM can support, this method can be also used with a dual RM code instead of the convolutional code.

Figure 10:
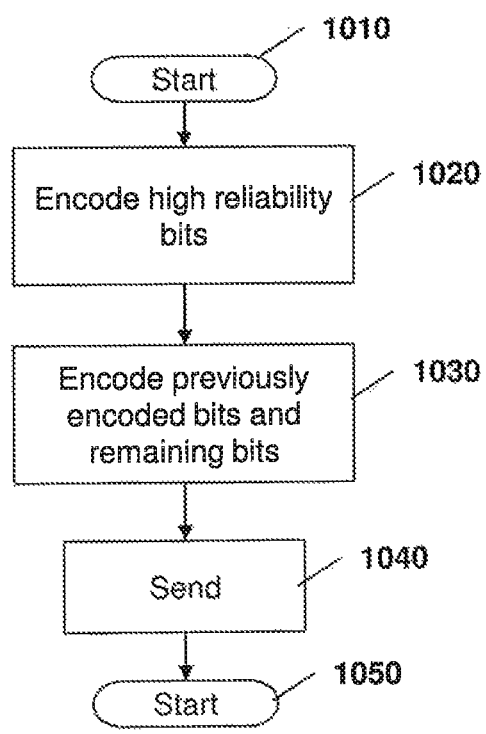
FIG. 10 is a flow chart showing coding procedure in UE.

Reference is now made to FIG. 10. The process of FIG. 10 starts at block 1010 and proceeds to block 1020 in which the higher reliability bits are encoded using a first encoding scheme. Such first encoding scheme may include, for example, RM coding, additional CRC, among others.

The process then proceeds to block 1030 in which the previously encoded bits are further encoded along with the regular reliability bits. The encoding at block 1030 may be convolutional coding, RM coding, among others.

The process then proceeds to block 1040 and sends or transmits the output from block 1030. In the transmission, the higher reliability bits are encoded twice. The process then proceeds to block 1050 and ends.

Separate Modulation Symbol Distribution

In a further embodiment, if separate coding of the HARQ-ACK and CSI is assumed, a further way to provide unequal error protection is to assign the HARQ-ACK modulated symbols to REs with more favorable RE positions. For instance, the modulated symbols of the HARQ-ACK may be mapped to an OFDM symbol adjacent to the reference symbol as much as possible, while CSI modulated symbols may be assigned to OFDM symbols further away from the reference symbols. Thus, referring to FIGS. 5, 6 and 7, any of blocks 540, 650 or 750 may be utilized to provide for the modulated symbols for the first RM block to be closer to the reference symbols.

Thus, in accordance with the above, a benefit of separately encoding the HARQ-ACK and CSI is the enablement of separate control over the two payload types such as through higher power control and/or rate matching. This increases flexibility and can lead to more accurate tradeoffs in reliability between the two control message types when using the limited resources which are available.

When using joint encoding for HARQ-ACK and CSI payload types, the control information may be evenly distributed across the two component codes to maximize decoding performance. Further, an additional benefit may be obtained by placing higher value control information in the payload bits offering greater reliability in order to mitigate the impact of decoder failure.

The above may be implemented by any network element. A simplified network element is shown with regard to FIG. 11.

Figure 11:
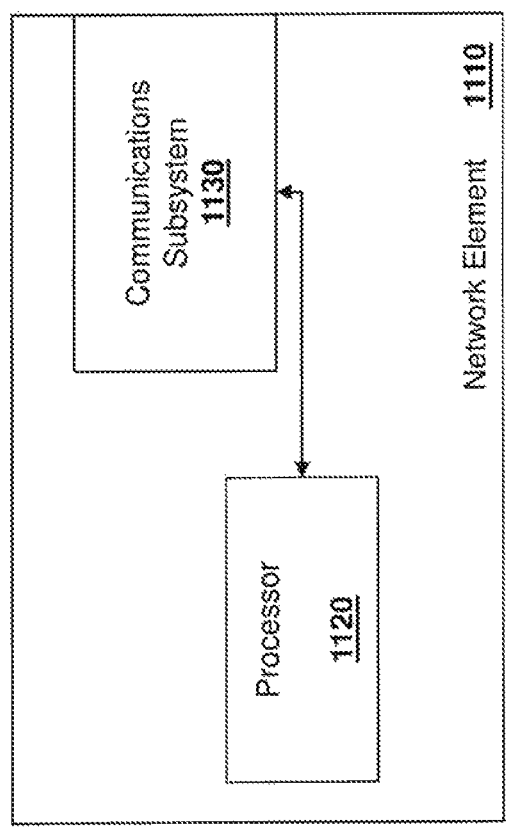
FIG. 11 is a block diagram showing a simplified example network element.

In FIG. 11, network element 1110 includes a processor 1120 and a communications subsystem 1130, where the processor 1120 and communications subsystem 1130 cooperate to perform the methods described above.

Further, the above may be implemented by any UE. One exemplary device is described below with regard to FIG. 12.

UE 1200 is typically a two-way wireless communication device having voice and data communication capabilities. UE 1200 generally has the capability to communicate with other computer systems on the Internet. Depending on the exact functionality provided, the UE may be referred to as a data messaging device, a two-way pager, a wireless e-mail device, a cellular telephone with data messaging capabilities, a wireless Internet appliance, a wireless device, a mobile device, or a data communication device, as examples.

Where UE 1200 is enabled for two-way communication, it may incorporate a communication subsystem 1211, including both a receiver 1212 and a transmitter 1214, as well as associated components such as one or more antenna elements 1216 and 1218, local oscillators (LOs) 1213, and a processing module such as a digital signal processor (DSP) 1220. As will be apparent to those skilled in the field of communications, the particular design of the communication subsystem 1211 will be dependent upon the communication network in which the device is intended to operate. The radio frequency front end of communication subsystem 1211 can be any of the embodiments described above.

Network access requirements will also vary depending upon the type of network 1219. In some networks network access is associated with a subscriber or user of UE 1200. A UE may require a removable user identity module (RUIM) or a subscriber identity module (SIM) card in order to operate on a network. The SIM/RUIM interface 1244 is normally similar to a card-slot into which a SIM/RUIM card can be inserted and ejected. The SIM/RUIM card can have memory and hold many key configurations 1251, and other information 1253 such as identification, and subscriber related information.

Figure 12:
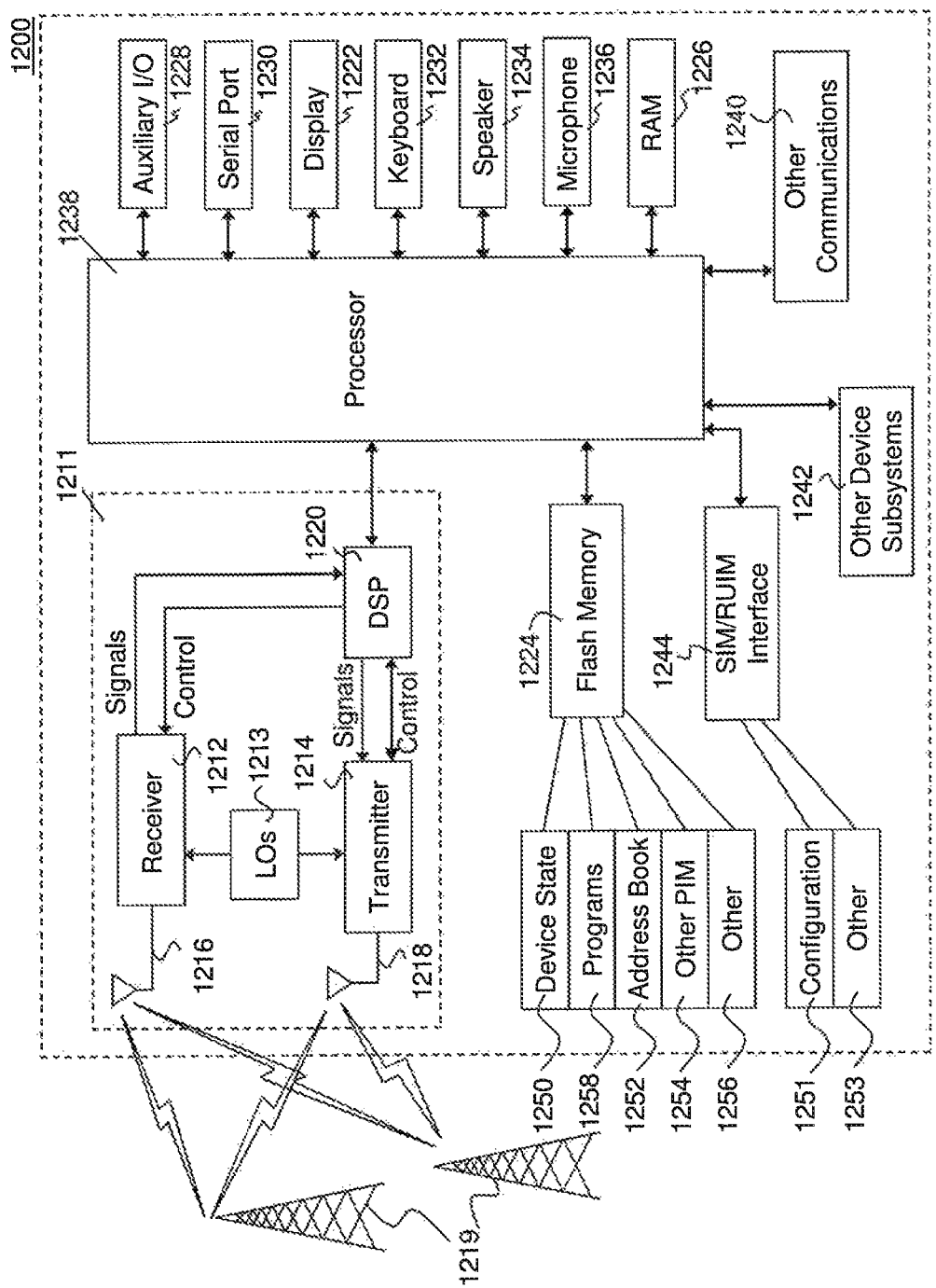
FIG. 12 is a block diagram of an example user equipment.

When required network registration or activation procedures have been completed, UE 1200 may send and receive communication signals over the network 1219. As illustrated in FIG. 12, network 1219 can consist of multiple base stations communicating with the UE.

Signals received by antenna 1216 through communication network 1219 are input to receiver 1212, which may perform such common receiver functions as signal amplification, frequency down conversion, filtering, channel selection and the like. A/D conversion of a received signal allows more complex communication functions such as demodulation and decoding to be performed in the DSP 1220. In a similar manner, signals to be transmitted are processed, including modulation and encoding for example, by DSP 1220 and input to transmitter 1214 for digital to analog conversion, frequency up conversion, filtering, amplification and transmission over the communication network 1219 via antenna 1218. DSP 1220 not only processes communication signals, but also provides for receiver and transmitter control. For example, the gains applied to communication signals in receiver 1212 and transmitter 1214 may be adaptively controlled through automatic gain control algorithms implemented in DSP 1220.

UE 1200 generally includes a processor 1238 which controls the overall operation of the device. Communication functions, including data and voice communications, are performed through communication subsystem 1211. Processor 1238 also interacts with further device subsystems such as the display 1222, flash memory 1224, random access memory (RAM) 1226, auxiliary input/output (I/O) subsystems 1228, serial port 1230, one or more keyboards or keypads 1232, speaker 1234, microphone 1236, other communication subsystem 1240 such as a short-range communications subsystem and any other device subsystems generally designated as 1242. Serial port 1230 could include a USB port or other port known to those in the art.

Some of the subsystems shown in FIG. 12 perform communication-related functions, whereas other subsystems may provide "resident" or on-device functions. Notably, some subsystems, such as keyboard 1232 and display 1222, for example, may be used for both communication-related functions, such as entering a text message for transmission over a communication network, and device-resident functions such as a calculator or task list.

Operating system software used by the processor 1238 may be stored in a persistent store such as flash memory 1224, which may instead be a read-only memory (ROM) or similar storage element (not shown). Those skilled in the art will appreciate that the operating system, specific device applications, or parts thereof, may be temporarily loaded into a volatile memory such as RAM 1226. Received communication signals may also be stored in RAM 1226.

As shown, flash memory 1224 can be segregated into different areas for both computer programs 1258 and program data storage 1250, 1252, 1254 and 1256. These different storage types indicate that each program can allocate a portion of flash memory 1224 for their own data storage requirements. Processor 1238, in addition to its operating system functions, may enable execution of software applications on the UE. A predetermined set of applications that control basic operations, including at least data and voice communication applications for example, will normally be installed on UE 1200 during manufacturing. Other applications could be installed subsequently or dynamically.

Applications and software may be stored on any computer readable storage medium. The computer readable storage medium may be a tangible or in transitory/non-transitory medium such as optical (e.g., CD, DVD, etc.), magnetic (e.g., tape) or other memory known in the art.

One software application may be a personal information manager (PIM) application having the ability to organize and manage data items relating to the user of the UE such as, but not limited to, e-mail, calendar events, voice mails, appointments, and task items. Naturally, one or more memory stores would be available on the UE to facilitate storage of PIM data items. Such PIM application may have the ability to send and receive data items, via the wireless network 1219. Further applications may also be loaded onto the UE 1200 through the network 1219, an auxiliary I/O subsystem 1228, serial port 1230, short-range communications subsystem 1240 or any other suitable subsystem 1242, and installed by a user in the RAM 1226 or a non-volatile store (not shown) for execution by the processor 1238. Such flexibility in application installation increases the functionality of the device and may provide enhanced on-device functions, communication-related functions, or both. For example, secure communication applications may enable electronic commerce functions and other such financial transactions to be performed using the UE 1200.

In a data communication mode, a received signal such as a text message or web page download will be processed by the communication subsystem 1211 and input to the processor 1238, which may further process the received signal for output to the display 1222, or alternatively to an auxiliary I/O device 1228.

A user of UE 1200 may also compose data items such as email messages for example, using the keyboard 1232, which may be a complete alphanumeric keyboard or telephone-type keypad, among others, in conjunction with the display 1222 and possibly an auxiliary I/O device 1228. Such composed items may then be transmitted over a communication network through the communication subsystem 1211.

For voice communications, overall operation of UE 1200 is similar, except that received signals would typically be output to a speaker 1234 and signals for transmission would be generated by a microphone 1236. Alternative voice or audio I/O subsystems, such as a voice message recording subsystem, may also be implemented on UE 1200. Although voice or audio signal output is generally accomplished primarily through the speaker 1234, display 1222 may also be used to provide an indication of the identity of a calling party, the duration of a voice call, or other voice call related information for example.

Serial port 1230 in FIG. 12 would normally be implemented in a personal digital assistant (PDA)-type UE for which synchronization with a user's desktop computer (not shown) may be desirable, but is an optional device component. Such a port 1230 would enable a user to set preferences through an external device or software application and would extend the capabilities of UE 1200 by providing for information or software downloads to UE 1200 other than through a wireless communication network. The alternate download path may for example be used to load an encryption key onto the device through a direct and thus reliable and trusted connection to thereby enable secure device communication. As will be appreciated by those skilled in the art, serial port 1230 can further be used to connect the UE to a computer to act as a modem.

Other communications subsystems 1240, such as a short-range communications subsystem, is a further optional component which may provide for communication between UE 1200 and different systems or devices, which need not necessarily be similar devices. For example, the subsystem 1240 may include an infrared device and associated circuits and components or a Bluetooth™ communication module to provide for communication with similarly enabled systems and devices. Subsystem 1240 may further include non-cellular communications such as WiFi or WiMAX.

The embodiments described herein are examples of structures, systems or methods having elements corresponding to elements of the techniques of this application. This written description may enable those skilled in the art to make and use embodiments having alternative elements that likewise correspond to the elements of the techniques of this application. The intended scope of the techniques of this application thus includes other structures, systems or methods that do not differ from the techniques of this application as described herein, and further includes other structures, systems or methods with insubstantial differences from the techniques of this application as described herein.

What is claimed is:

1. A method for simultaneous transmission of a first set of information bits and a second set of information bits by a user equipment, the method comprising:

separately encoding the first set of information bits and the second set of information bits, the first set of information bits including hybrid automatic repeat request (HARQ) acknowledgement (ACK) bits and the second set of information bits including channel state information; and transmitting the encoded first set of information bits at a different transmission power than the encoded second set of information bits, wherein the encoded first set of information bits is transmitted on one of slot 0 or slot 1 in a subframe, and the encoded second set of information bits is transmitted on the other of slot 0 or slot 1 in the subframe; and wherein the slot for transmission of the first set of information bits alternates in subsequent subframes.

2. The method of claim 1, wherein the first set of information bits further includes rank indicator bits.

3. The method of claim 1, wherein the transmission power is determined based in part on an offset parameter for the first set of information bits or the second set of information bits.

4. A method for simultaneous transmission of a first set of information bits and a second set of information bits by a user equipment, the method comprising:

separately encoding, utilizing linear block encoders, the first set of information bits and the second set of information bits, the first information bits including hybrid automatic repeat request (HARQ) acknowledgement (ACK) bits and the second information bits including channel state information;

applying a first rate matching to the encoded first set of information bits, a parameter of the first rate matching being chosen from a value representing the minimum of an upper limit and a second value, the second value calculated by multiplying the number of first information bits by a bias value;

using a second rate matching for the encoded second set of information bits, the second rate matching being different than the first rate matching, a parameter of the second rate matching determined by a predefined value minus the first rate matching value; and transmitting the encoded rate-matched first set of information bits and the encoded rate-matched second set of information bits.

5. The method of claim 4, wherein the first set of information bits further includes rank indicator bits.

6. The method of claim 4, wherein the applying and using employ a circular buffer.

7. A method for simultaneous transmission of a first set of information bits and a second set of information bits by a user equipment, the method comprising:

distributing the first set of information bits between a first bit vector and a second bit vector and distributing the second set of information bits between the first bit vector and the second bit vector, the first set of information bits including hybrid automatic repeat request (HARQ) acknowledgement (ACK) bits and the second set of information bits including channel state information;

separately encoding the first bit vector into a first codeword and encoding the second bit vector into a second codeword; and transmitting the first codeword and second codeword, wherein the first set of information bits is distributed within the most significant bits of the first bit vector and second bit vector.

8. The method of claim 7, wherein the first set of information bits contains values known a priori at a receiver.

9. The method of claim 7, wherein the first set of information bits and the second set of information bits are ordered so that hybrid automatic repeat request (HARQ) acknowledgement (ACK) bits are followed by other information bits.

10. The method of claim 7, wherein the first set of information bits and the second set of information bits are ordered so that a rank indicator is followed by other information bits.

11. The method of claim 9, wherein ordering is selected based on higher layer signaling.

12. A method for simultaneous transmission of a first set of information bits, and a second set of information bits by a user equipment, the method comprising:
   first encoding the first set of information bits utilizing a cyclic redundancy check code, the first set of information bits including hybrid automatic repeat request (HARQ) acknowledgement (ACK) bits;
   further encoding the encoded first set of information bits with the second set of information bits utilizing a convolutional code or a Reed Muller code, the second set of information bits including channel state information; and
   transmitting the further encoded bits.

13. The method of claim 12, wherein the first set of information bits further includes rank indicator bits.

14. A method for simultaneous transmission of a first set of information bits and a second set of information bits by a user equipment, the method comprising:
   separately encoding the first set of information bits and the second set of information bits, the first set of information bits including hybrid automatic repeat request (HARQ) acknowledgement (ACK) bits and the second set of information bits including channel state information;
   modulating the encoded first set of information bits and the encoded second set of information bits to create modulated symbols;
   mapping the modulated symbols of the encoded first set of information bits to symbols adjacent to a reference symbol;
   mapping the modulated symbols of the encoded second set of information bits to remaining symbols; and
   transmitting the encoded first set of information bits and the encoded second set of information bits.

15. The method of claim 14, wherein the first set of information bits further includes rank indicator bits.

* * * * *